United States Patent
Schiavoni et al.

(10) Patent No.: US 9,257,580 B2
(45) Date of Patent: Feb. 9, 2016

(54) TEXTURED TRANSPARENT PLATE AND METHOD OF MANUFACTURING SUCH A PLATE

(75) Inventors: Michele Schiavoni, Paris (FR); Patrick Gayout, Villemomble (FR); Wolfgang Andreas Nositschka, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 948 days.

(21) Appl. No.: 13/384,406

(22) PCT Filed: Jul. 15, 2010

(86) PCT No.: PCT/EP2010/060199
§ 371 (c)(1),
(2), (4) Date: Feb. 28, 2012

(87) PCT Pub. No.: WO2011/006957
PCT Pub. Date: Jan. 20, 2011

(65) Prior Publication Data
US 2012/0183734 A1   Jul. 19, 2012

(30) Foreign Application Priority Data
Jul. 16, 2009  (FR) ...................................... 09 54908

(51) Int. Cl.
*B32B 3/00* (2006.01)
*H01L 31/0236* (2006.01)
(Continued)

(52) U.S. Cl.
CPC .............. *H01L 31/0236* (2013.01); *G02B 5/02* (2013.01); *H01L 31/0392* (2013.01); *Y02E 10/52* (2013.01); *Y10T 428/24479* (2015.01)

(58) Field of Classification Search
CPC .............. B32B 3/00; B32B 3/28; B32B 3/30; F24J 2/062; F24J 2/085; G02B 19/0042; G02B 19/0061; G02B 5/045; G02B 5/0231; G02B 5/003; G02B 5/0221; G02B 5/124; G02B 6/0038; B29C 2043/023; B29C 59/04; C03B 13/08; Y02E 10/50; Y02E 10/40; Y02E 10/543; Y02E 10/52; Y10T 156/1018; Y10T 156/1023; Y10T 428/2457; Y10T 428/24612
USPC ........................... 428/156, 167, 172; 136/246
See application file for complete search history.

(56) References Cited

U.S. PATENT DOCUMENTS 7,645,058 B2 * 1/2010 Kurokawa et al. ............ 362/339
2003/0180476 A1   9/2003 Yamashita et al.
(Continued)

FOREIGN PATENT DOCUMENTS

WO   WO 2005083475 A1 * 9/2005

OTHER PUBLICATIONS

U.S. Appl. No. 14/015,421, filed Aug. 30, 2013, Gayout, et al.
(Continued)

*Primary Examiner* — Catherine A Simone
(74) *Attorney, Agent, or Firm* — Oblon, McClelland, Maier & Neustadt, L.L.P.

(57) ABSTRACT

A monolithic transparent plate including, on at least one of its faces, at least one region textured by a plurality of geometric features in relief relative to a general plane of the face, each feature having a cross section, parallel to the general plane, which diminishes with distance from the face, from a base to a peak of the feature. The area of the zones of the textured region for which the inclination angle relative to the general plane is less than 30° C. represents less than 35% of the total area of the textured region.

14 Claims, 3 Drawing Sheets

(51) Int. Cl.
*G02B 5/02* (2006.01)
*H01L 31/0392* (2006.01)

(56) References Cited

U.S. PATENT DOCUMENTS

| | | |
|---|---|---|
| 2006/0176429 A1 | 8/2006 | Watchi et al. |
| 2007/0240754 A1 | 10/2007 | Gayout et al. |
| 2009/0266407 A1 | 10/2009 | Harder et al. |
| 2009/0320899 A1 | 12/2009 | Schiavoni et al. |
| 2010/0051093 A1 | 3/2010 | Harder et al. |
| 2010/0116332 A1 | 5/2010 | Counil et al. |
| 2010/0154862 A1 | 6/2010 | Schiavoni et al. |
| 2011/0209761 A1 | 9/2011 | Counil et al. |
| 2011/0281078 A1 | 11/2011 | Schiavoni et al. |

OTHER PUBLICATIONS

International Search Report and Written Opinion of the International Searching Authority (in French) issued Jan. 12, 2012 in patent application No. PCT/EP2010/060199 filed Jul. 15, 2010.

A. Scheydecker, et al., "Reduction of Reflection Losses of PV-Modules by Structured Surfaces", 2382 Solar Energy, vol. 53, No. 2, XP 462080A, 1994, pp. 171-176.

* cited by examiner

TEXTURED TRANSPARENT PLATE AND METHOD OF MANUFACTURING SUCH A PLATE

CROSS-REFERENCE TO PRIORITY APPLICATIONS

The present application is the U.S. counterpart of WO 2011/006957 and claims priority to French application no. 0954908 filed Jul. 16, 2009, the entire contents of each of which are incorporated herein by reference in their entirety.

BACKGROUND

The present invention relates to a transparent plate comprising, on at least one of its faces, a plurality of geometric features in relief relative to a general plane of said face. The invention also relates to an assembly comprising such a transparent plate and an element capable of collecting or emitting radiation. Furthermore, the invention relates to a method of manufacturing such a transparent plate.

An element capable of collecting radiation is, in particular, an element able to collect and convert the energy originating from a radiation into electrical energy, such as a photovoltaic cell. An element capable of emitting radiation is, in particular, an element able to convert electrical energy into radiation, such as an OLED (Organic Light Emitting Diode).

Conventionally, a photovoltaic module or an OLED device comprises, as a front substrate (or substrate having a glass function), a transparent plate which mechanically protects the energy conversion elements, namely the photovoltaic cells or the OLED structures, whilst allowing a good transmission of radiation toward or from these energy conversion elements. This transparent plate may, in particular, be made of a transparent glass, preferably clear or extra-clear glass, having a very low content of iron oxides, such as the glass "DIAMANT" or the glass "ALBARINO" marketed by Saint-Gobain Glass.

One way of increasing the energy conversion efficiency of a photovoltaic module or an OLED device is to improve the transmission properties of the plate forming the front substrate, by limiting the reflection of the radiation incident on the plate, coming either from the air in the case of a photovoltaic module, or from the inside of the device in the case of an OLED device. To this end, it is known to texture at least the face of the plate directed away from the energy conversion elements, by providing it with a plurality of concave or convex geometric features in relief with respect to a general plane of this face. Within the meaning of the invention, the general plane of a textured face is the plane containing the points of this face which do not form part of the features or, in the case of contiguous features, the points at the junctions between the features. The features may, in particular, be pyramids or cones, or features that have a favored longitudinal direction, such as grooves or ribs. However, the increase in efficiency due to the use of prior art textured plates as front substrates of energy conversion devices remains limited. This is because conventional texturing techniques, in particular by rolling, as described in patent applications WO-A-03/046617, WO-A-2005/111670 and WO-A-2007/015019, do not at the present time allow features having a perfect geometry to be formed.

SUMMARY

It is this drawback that the invention more particularly seeks to overcome by providing a transparent plate that has optimized transmission properties of a radiation incident on the plate and which enables, in particular, when integrated as the front substrate into an energy conversion device, such as a photovoltaic module or an OLED device, the transmission of a radiation incident on the plate toward or from the energy conversion elements of the device to be optimized, thus making it possible to increase the efficiency of this device relative to prior art devices.

To this end, one subject of the invention is a monolithic transparent plate comprising, on at least one of its faces, at least one region textured by a plurality of geometric features in relief relative to a general plane of said face, each feature having a cross section, parallel to the general plane, that diminishes with distance from the aforementioned face of the plate, from a base to a peak of the feature, characterized in that the area of the zones of the textured region for which the inclination angle relative to the general plane is less than 30° represents less than 35% of the total area of the textured region, and in that:
  either (i) the ratio $\rho$ of the thickness of each feature to the thickness of the plate has a given value that is greater than or equal to 0.2 and the thickness of the plate lies within a range extending from 4.5 mm to 8 mm,
  or (ii) the thickness of the plate has a given value that lies within a range extending from 3 mm to 8 mm and the ratio $\rho$ of the thickness of each feature to the thickness of the plate is greater than or equal to 0.3.

Within the meaning of the invention, a transparent plate is a plate that is transparent at least in the wavelength ranges of use for, or emitted by, the energy conversion elements of the device into which the plate is intended to be integrated as a front substrate. By way of example, in the case of a photovoltaic module comprising photovoltaic cells based on polycrystalline silicon, the plate is advantageously transparent in the wavelength range between 400 nm and 1200 nm. In addition, within the frame of the invention, a plate is monolithic in the sense that the features and the plate form a single object, the features being formed by local surface deformation of the plate, for example during molding of the plate or by rolling the plate. Thus, the features of the plate have the same chemical composition as the plate. Moreover, within the meaning of the invention, a feature in relief relative to a plane is a feature that projects or is recessed relative to this plane.

According to other advantageous features of a plate according to the invention, which may be implemented individually or in any technically possible combination:
  each feature is bounded, in cross section along at least one plane passing through the peak of the feature and perpendicular to the general plane, by two sides each inclined at a nonzero average inclination angle relative to the general plane, the zones of the textured region for which the inclination angle of the zone relative to said general plane is less than 30° forming connecting zones between one side of a feature and the other side of the feature or the side of an adjacent feature;
  the plate has a thickness that lies between 3 mm and 8 mm;
  each feature has a thickness greater than or equal to 0.5 mm;
  the average inclination angle of each side of a feature relative to the general plane lies between 40° and 65°, preferably between 45° and 60°;
  for a given ratio $\rho$ of the thickness of each feature to the thickness of the plate, the thickness of the plate has an optimal value that corresponds to maximum transmission through the plate of a radiation incident on said face of the plate;

when condition (i) is fulfilled, the ratio ρ of the thickness of each feature to the thickness of the plate is greater than or equal to 0.25;

when condition (i) is fulfilled, the ratio ρ of the thickness of each feature to the thickness of the plate is greater than or equal to 0.3;

the plate is made of glass, preferably a clear or extra-clear transparent glass;

the plate is made of a transparent polymer;

the features are contiguous;

the features are identical to one another;

the features are randomly distributed over the face;

the features are pyramids or cones having nonzero apex half-angles;

the base of each feature is inscribed within a circle having a diameter of less than or equal to 5 mm;

the features are grooves or ribs;

the plate is formed by rolling;

the plate is formed by molding.

Another subject of the invention is an assembly comprising a transparent plate as described above and an element capable of collecting or emitting radiation, the element being positioned relative to the plate so as to be able to collect a radiation passing through the plate or to emit a radiation through the plate, the textured face of the plate being directed away from the element.

Finally, another subject of the invention is a method of manufacturing a plate as described above, comprising forming, on at least one face of a plate made of a transparent material, geometric features in relief relative to a general plane of the face, while maximizing the thickness of each feature.

Advantageously, the features are formed by rolling the plate.

As a variant, the features may be formed by molding the plate.

According to a first variant of the manufacturing method, for a given period of the features, the depth of each feature is maximized by maximizing the average inclination angle of the sides of the feature relative to the general plane of the face.

According to a second variant of the manufacturing method, for a given average inclination angle of the sides of each feature relative to the general plane of the face, the depth of each feature is maximized by maximizing the period of the features.

BRIEF DESCRIPTION OF THE DRAWINGS

The features and advantages of the invention will be made clear by the following description of three embodiments of a plate and an assembly according to the invention, given merely by way of example and with reference to the appended drawings in which.

DETAILED DESCRIPTION

Figure 1:
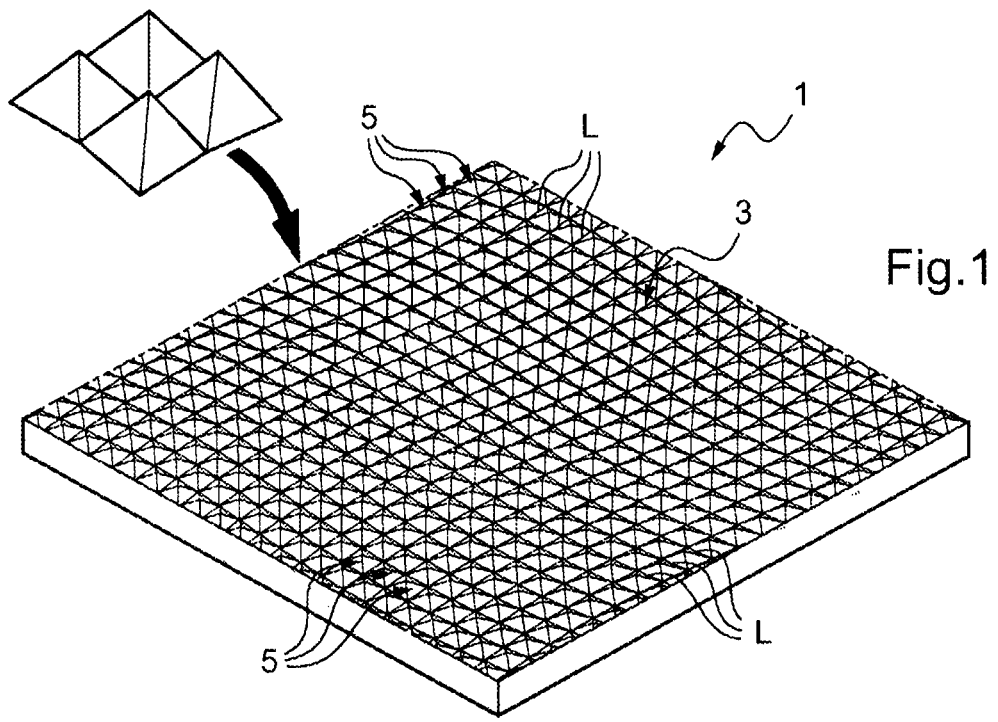
FIG. 1 shows a perspective view of a textured transparent plate according to a first embodiment of the invention.
Figure 2:
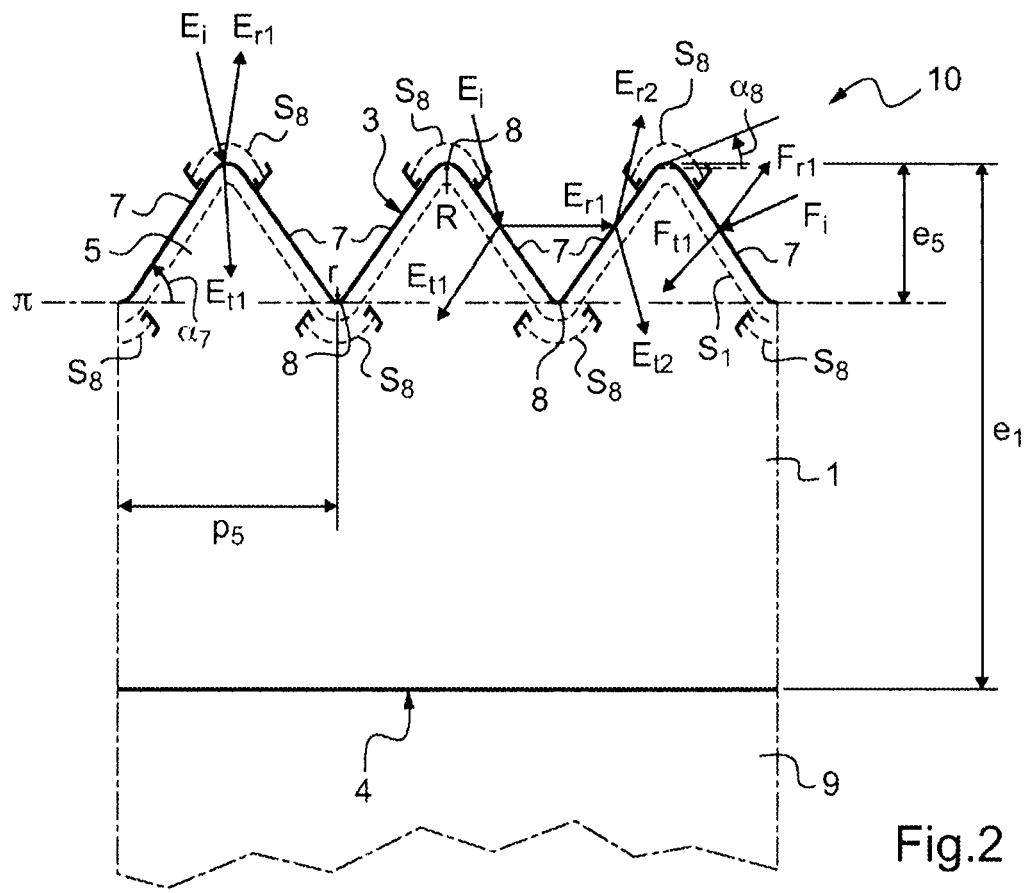
FIG. 2 shows a partial and schematic cross section of a photovoltaic module comprising the plate of FIG. 1 as the front substrate.

In the first embodiment of the invention shown in FIGS. 1 and 2, the transparent plate 1 according to the invention is a rolled and patterned extra-clear transparent glass plate, which comprises on one of its faces 3 a convex texture consisting of an array of contiguous pyramidal features 5.

As may be clearly seen in FIG. 1, the pyramidal features 5 of the face 3 are aligned along undulating lines L. Within the meaning of the invention, the alignment lines L of the features 5 are the lines formed by successive identical sides of pyramidal features located adjacent to one another, in rows. In the embodiment shown in FIG. 1, the longitudinal directions of the sides of the successive pyramidal features 5 along each alignment line L are modified in steps. Thus, superposed on the general or overall direction of the alignment lines L is a variation in the direction of the sides of the individual pyramidal features, which produces the undulation of the alignment lines L. As taught in application WO-A-2006/134301, such a random distribution of the pyramidal features 5 over the face 3 makes it possible to reduce the average absolute intensity of the reflection on the plate 1 for each individual reflection angle and to avoid pronounced transitions between reflecting directions and nonreflecting directions. The result of this is that the plate 1 has a more uniform appearance and the risks of glare are minimized.

FIG. 2 shows, partially and schematically, a photovoltaic module 10 according to the invention, comprising the plate 1 as the front substrate. As this figure shows, the face 3 of the plate 1, which is provided with the texture 5, is on the side on which the radiation is incident on the module 10. In this embodiment, the face 4 of the plate 1 opposite from the front face 3 is overall flat and positioned facing one or more photovoltaic cells 9.

The absorber layer of the or each photovoltaic cell 9, able to ensure the conversion of the energy originating from the radiation incident on the cell into electrical energy, may, in particular, be a thin film based on amorphous or microcrystalline silicon, or based on cadmium telluride. In this case, as known, the or each thin film cell 9 comprises the following successive multilayer stack, starting from the face 4 of the plate 1:

an electrically conductive transparent layer, in particular based on a Transparent Conductive Oxide (TOO), which forms a front electrode of the cell;

the absorber layer;

an electrically conductive layer which forms a back electrode of the cell.

In practice, the or each cell 9 is held between the front substrate 1 and a back substrate, not shown, of the module 10.

As a variant, the absorber layer of the or each cell 9 may be a thin film of a chalcopyrite compound comprising copper, indium and selenium, denoted CIS absorber layer, to which may optionally be added gallium (CIGS absorber layer), aluminum or sulfur. In this case, the or each thin-film cell 9 comprises a multilayer stack analogous to that described above, a polymer lamination interlayer, not shown, being furthermore positioned between the front electrode of the cell 9 and the face 4 of the plate 1 so as to guarantee a good cohesion of the module 10 when assembled. The lamination interlayer may, in particular, be made of polyvinyl butyral (PVB) or of ethylene vinyl acetate (EVA).

According to yet another variant, the or each cell 9 may be made from polycrystalline or monocrystalline silicon wafers forming a p-n junction.

Figure 3:
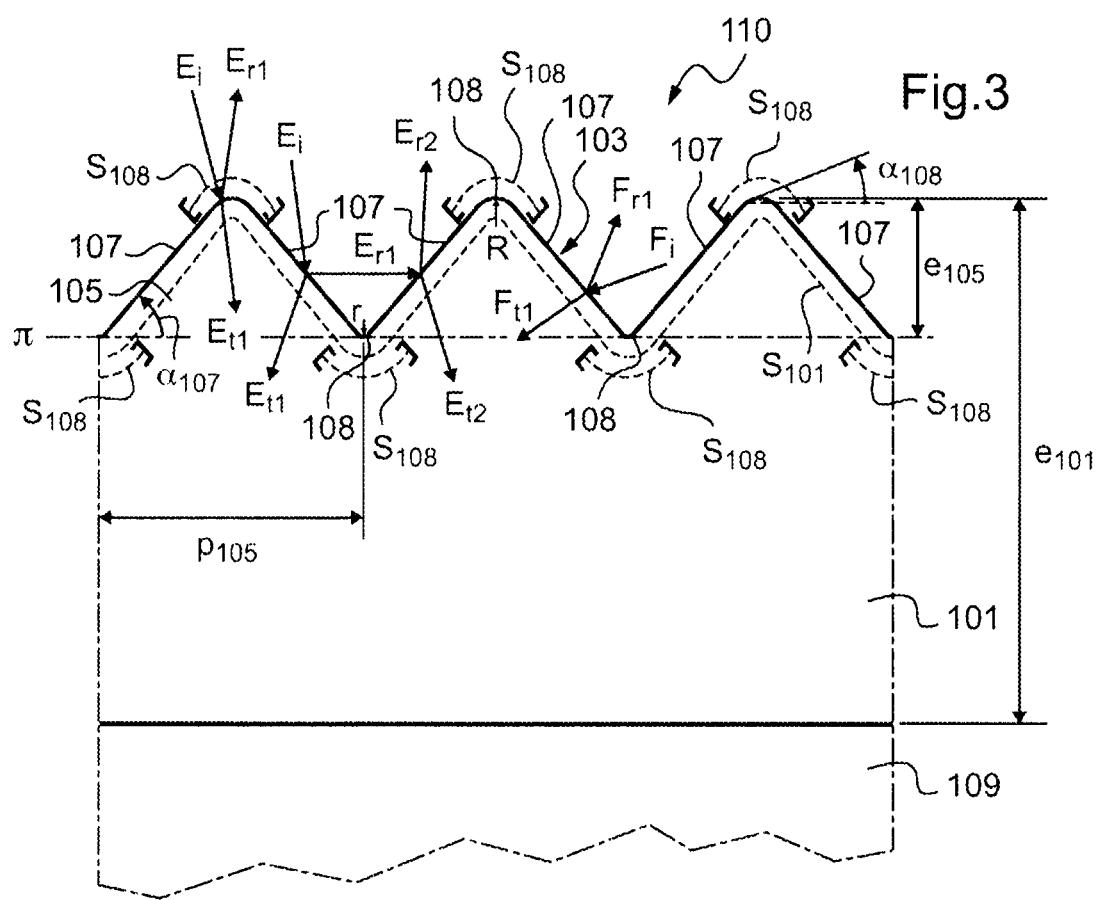
FIG. 3 shows a section, analogous to that shown in FIG. 2, of a photovoltaic module comprising a textured transparent plate according to a second embodiment of the invention as the front substrate.
Figure 5:
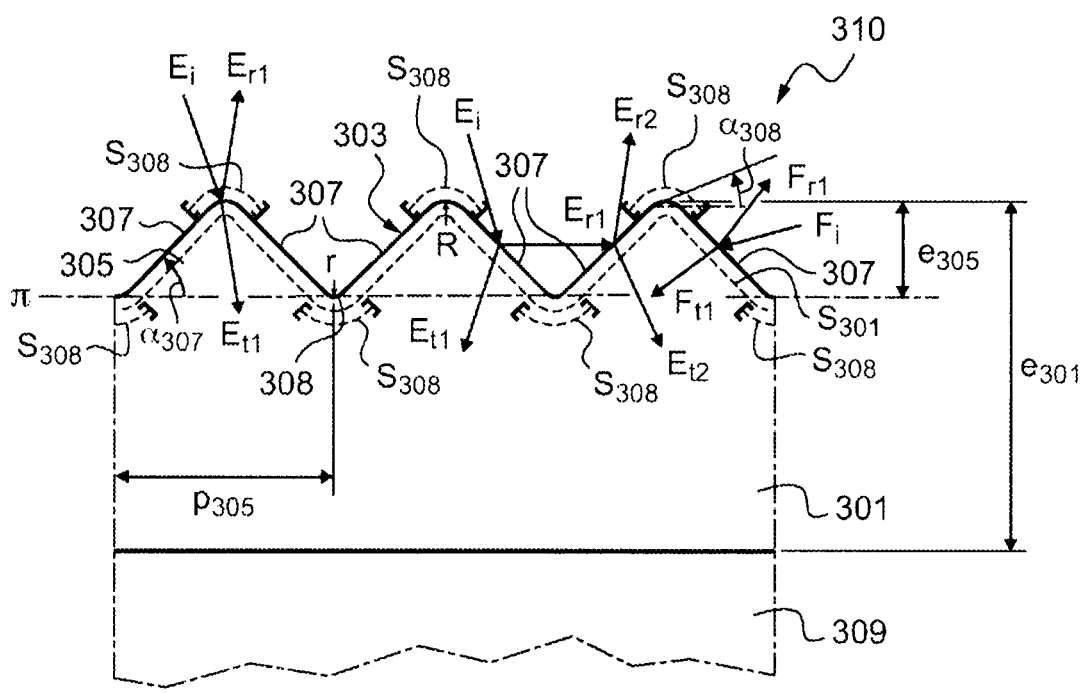
FIG. 5 shows a section, analogous to that shown in FIG. 2, of a photovoltaic module comprising a textured transparent plate of the prior art, having the same glass matrix as the plates of FIGS. 2 to 4, as the front substrate.
Figure 4:
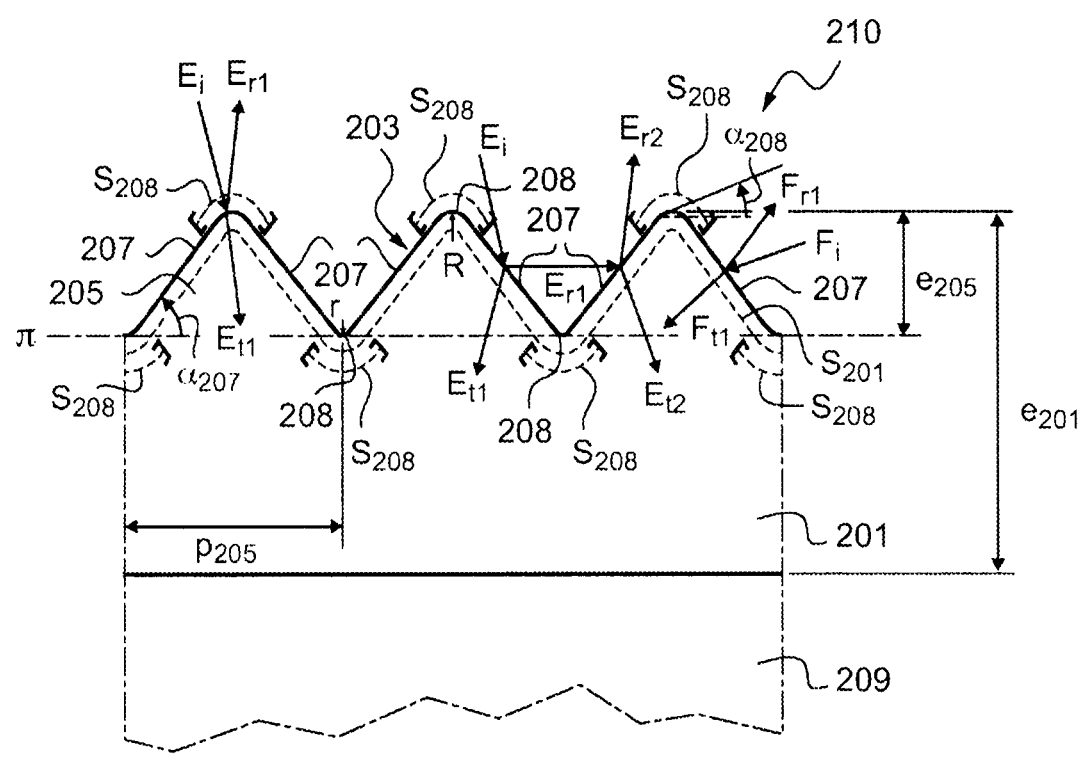
FIG. 4 shows a section, analogous to that shown in FIG. 2, of a photovoltaic module comprising a textured transparent plate according to a third embodiment of the invention as the front substrate.

FIGS. 3 to 5 show photovoltaic modules 110, 210 and 310 comprising respectively, as front substrates, a transparent plate 101 according to a second embodiment of the invention, a transparent plate 201 according to a third embodiment of the invention and a transparent plate 301 according to the prior art. The plates 101, 201, 301 are made of extra-clear transparent glass of the same composition as the glass of the plate 1 and are placed on top of one or more photovoltaic cells 109, 209 or 309 analogous to the photovoltaic cells 9 of the module 10. Each of the plates 101, 201 and 301 comprises a front face 103, 203 or 303 intended to be on the side on which the radiation is incident on the module, which is provided with a pyramidal texture analogous to that of plate 1, consisting of a plurality of contiguous pyramidal features 105, 205 or 305 of which the bases are parallelograms and the apex half-angles are nonzero.

Each of the pyramidal features 305 of the plate 301 according to the prior art has, as base, a parallelogram of 2 mm side length and a apex half-angle of approximately 45°. Each pyramidal feature 305 is thus bounded by four sides 307 each inclined at an inclination angle $\alpha_{307}$ of approximately 45° relative to a general plane π of the textured face 303. Each feature 305 has a thickness $e_{305}$ of 1 mm in projection relative to the general plane π so that the total thickness $e_{301}$ of the plate 301 with its texture is 4 mm.

Each of the pyramidal features 5 of the plate 1 according to the first embodiment of the invention is bounded by four sides 7, each inclined at an inclination angle $\alpha_7$ relative to a general plane π of the textured face 3. The plate 1 of the first embodiment differs from the plate 301 according to the prior art in that, on the one hand, it has a total thickness $e_1$ of 6 mm including its texture, instead of a thickness $e_{301}$ of 4 mm and, on the other hand, each pyramidal feature 5 has a thickness $e_5$ of 1.5 mm in projection relative to a general plane π of the face 3, instead of a thickness $e_{305}$ of 1 mm. The plates 1 and 301 thus have the same ratio, ρ=0.25, of the feature thickness $e_5$, $e_{305}$ to the plate thickness $e_1$, $e_{301}$. Comparison of FIGS. 2 and 5 shows that the base of each feature 5 of the plate 1 has the same dimensions as the base of the features 305 of the plate 301, namely a parallelogram base of 2 mm side length, but that the apex half-angle of each feature 5 is approximately 33° instead of 45° for the features 305 of the plate 301. In other words, for the same period $p_5$, $p_{305}$ of the features, the thickness $e_5$ of each feature 5 of the plate 1 according to the first embodiment has been increased relative to the thickness $e_{305}$ of each feature 305 of the plate 301 according to the prior art by increasing the inclination angle $\alpha_7$ of the sides 7 of the features 5 relative to the inclination angle $\alpha_{307}$ of the sides 307 of the features 305.

Similarly, each of the pyramidal features 105 of the plate 101 according to the second embodiment is bounded by four sides 107 each inclined at an inclination angle $\alpha_{107}$ relative to a general plane π of the textured face 103. As in the first embodiment, the plate 101 has a total thickness $e_{101}$ of 6 mm including its texture, instead of a plate thickness $e_{301}$ of 4 mm as for the plate 301 according to the prior art, and each pyramidal feature 105 of the plate 101 has a thickness $e_{105}$ of 1.5 mm in projection relative a general plane π of the face 103, instead of a thickness $e_{305}$ of 1 mm as for the features 305 of the plate 301 according to the prior art. The plates 101 and 301 therefore have the same ratio, ρ=0.25, of the feature thickness $e_{105}$, $e_{305}$, to the plate thickness $e_{101}$, $e_{301}$. Comparison of FIGS. 3 and 5 shows that the apex half-angle of each feature 105 is equal to the apex half-angle of the features 305 of the plate 301, namely approximately 45°, but that the base of each feature 105 has a side length of 3 mm, instead of 2 mm as for the features 305 of the plate 301. In other words, for the same inclination angle $\alpha_{107}$, $\alpha_{307}$ of the sides 107, 307 of the features in relief, the thickness $e_{105}$ of each feature 105 of the plate 101 according to the second embodiment has been increased relative to the thickness $e_{305}$ of each feature 305 of the plate 301 according to the prior art by increasing the period $p_{105}$ of the features 105 relative to the period $p_{305}$ of the features 305.

The plate 201 shown in FIG. 4, according to the third embodiment, differs from the plate 301 according to the prior art in that each pyramidal feature 205 has a thickness $e_{205}$ of 1.2 mm in projection relative to a general plane π of the face 203, instead of a thickness $e_{235}$ of 1 mm, the total thickness $e_{201}$ of the plate 201 including its texture being equal to the thickness $e_{301}$ of the plate 301, that is to say 4 mm. For the same thickness $e_{201}$, $e_{301}$ of the plate, the ratio ρ of the thickness $e_{205}$ of the features 205 of the plate 201 to the thickness $e_{201}$ of the plate 201 is therefore equal to 0.3, instead of 0.25 as for the plate 301 according to the prior art. Each pyramidal feature 205 of the plate 201 is bounded by four sides 207 each inclined at an inclination angle $\alpha_{207}$ relative to a general plane π of the textured face 203. Comparison of FIGS. 4 and 5 shows that the base of each feature 205 of the plate 201 has the same dimensions as the base of the features 305 of the plate 301, namely a parallelogram base of 2 mm side length, but that the apex half-angle of each feature 205 is approximately 40° instead of 45° as for the features 305 of the plate 301. In other words, for the same period $p_{205}$, $p_{305}$ of the features, the thickness $e_{205}$ of each feature 205 of the plate 201 according to the third embodiment has been increased relative to the thickness $e_{305}$ of each feature 305 of the plate 301 according to the prior art by increasing the inclination angle $\alpha_{207}$ of the sides 207 of the features 205 relative to the inclination angle $\alpha_{307}$ of the sides 307 of the features 305.

Advantageously, the texture of a plate according to the invention is produced by rolling the surface of a glass plate that was originally flat, the glass being heated to a temperature at which its surface may be deformed using a solid object, such as a metal roller, having on its surface the inverse of the shape of the texture to be formed. As a variant, the texture may be obtained by molding.

With these two texturing techniques, rolling and molding, when the desired texture comprises features with flat sides and sharp angles, as is the case, for example, for pyramidal or conical features, or for features in the shape of grooves or ribs of triangular or trapezoidal cross section, the features formed do not have perfect geometrical shapes. Thus, for these various types of features, the peak of each feature and the valleys flanking each feature are rounded, as shown schematically for the pyramidal features in FIGS. 2 to 5 by the radii of curvature R and r. The radii of curvature R of the peaks and r of the valleys of the texture do not vary greatly with the thickness of the features in relief, due to the particular conditions of manufacture by rolling or molding. The conditions of manufacture by rolling cause the radius of curvature R of the peaks of the texture to be greater than the radius of curvature r of the valleys of the texture.

Connecting zones between one side 7, 107, 207, 307 of a feature 5, 105, 205, 305 of the plate 1, 101, 201 or 301 and the other side of the feature, or the side of an adjacent feature, for which the inclination angle $\alpha_8$, $\alpha_{108}$, $\alpha_{208}$, $\alpha_{308}$ relative to the general plane π at each point of the zone is less than 30°, are denoted 8, 108, 208, 308. These connecting zones 8, 108, 208, 308 correspond to the rounded peaks and valleys of the pyramidal texture 5, 105, 205 or 305 of the plate. The ratio of the area $S_{308}$ of the connecting zones 308 of the plate 301 according to the prior art, for which the inclination angle $\alpha_{308}$ relative to the general plane $\pi$ of the textured face 303 is less than 30°, to the total textured area $S_{301}$ of the plate 301 is about 36%. In comparison, the ratio of the area $S_8$, $S_{108}$, $S_{208}$ of the connecting zones 8, 108, 208 of each plate 1, 101, or 201 according to the invention, for which the inclination angle $\alpha_8$, $\alpha_{108}$, $\alpha_{208}$ relative to the general plane $\pi$ of the textured face 3, 103, 203 is less than 30°, to the total textured area $S_1$, $S_{101}$, $S_{201}$ of the plate is less than 30%. This decrease in the ratio is obtained, for the plates 1, 101, 201 according to the invention, by increasing the thickness $e_5$, $e_{105}$, $e_{205}$ of their features 5, 105, 205 relative to the thickness $e_{305}$ of the features 305 of the plate 301 according to the prior art. In FIGS. 2 to 5, the areas $S_8$, $S_{108}$, $S_{208}$, $S_{308}$ and $S_1$, $S_{101}$, $S_{201}$, $S_{301}$ are shown very schematically with dotted lines.

As a variant, the connecting zones 8, 108, 208, 308 may be defined as the zones connecting one side 7, 107, 207, 307 of a feature of the plate with the other side of the feature, or with the side of an adjacent feature, for which the inclination angle $\alpha_8$, $\alpha_{108}$, $\alpha_{208}$, $\alpha_{308}$ relative to the general plane $\pi$ at each point of the zone is less than 40°. With this definition, the ratio of the area $S_{308}$ of the connecting zones 308 of the plate 301 according to the prior art, for which the inclination angle $\alpha_{308}$ relative to the general plane $\pi$ of the textured face 303 is less than 40°, to the total textured area $S_{301}$ of the plate 301 is about 60%, whereas the ratio of the area $S_8$, $S_{108}$, $S_{208}$ of the connecting zones 8, 108, 208 of each plate 1, 101, 201 according to the invention, for which the inclination angle $\alpha_8$, $\alpha_{108}$, $\alpha_{208}$ relative to the general plane $\pi$ of the textured face 3, 103, 203 is less than 40°, to the total textured area $S_1$, $S_{101}$, $S_{201}$ of the plate is less than 45%.

Table 1 below shows the increase in the efficiency for an incidence angle of zero degree $\epsilon_{10}(0°)$, $\epsilon_{110}(0°)$, $\epsilon_{210}(0°)$, $\epsilon_{310}(0°)$, and in the annual overall efficiency for all incidence angles $\epsilon_{10}$, $\epsilon_{110}$, $\epsilon_{210}$, $\epsilon_{310}$, for the module 10, the module 110, the module 210 and the module 310 respectively, relative to the efficiency of a reference photovoltaic module, determined by optical simulation of the surface structures of the plates 1, 101, 201 and 301. The reference module differs from the modules 10, 110, 210, 310 only in that its front substrate is an untextured transparent plate having the same glass composition as the textured plates 1, 101, 201 and 301. The results for the annual overall efficiency $\epsilon_{10}$, $\epsilon_{110}$, $\epsilon_{210}$, $\epsilon_{310}$ were obtained using data of direct lighting at Cologne in Germany, corresponding to a module positioned so as to be inclined at an angle of about 35° relative to the horizontal, facing South. The efficiency values shown in Table 1 are determined by simulation, without taking into account the diffuse nature of the radiation, so that the real efficiency values are likely to be greater.

TABLE 1

| | Plate thickness | Feature thickness | Efficiency increase at 0° | Annual overall efficiency increase |
|---|---|---|---|---|
| Module 10 | $e_1 = 6$ mm | $e_5 = 1.5$ mm | $\epsilon_{10}(0°) = 3.0\%$ | $\epsilon_{10} = 4.5\%$ |
| Module 110 | $e_{101} = 6$ mm | $e_{105} = 1.5$ mm | $\epsilon_{110}(0°) = 4.0\%$ | $\epsilon_{110} = 4.5\%$ |
| Module 210 | $e_{201} = 4$ mm | $e_{205} = 1.2$ mm | $\epsilon_{210}(0°) = 3.0\%$ | $\epsilon_{210} = 4.5\%$ |
| Module 310 | $e_{301} = 4$ mm | $e_{305} = 1$ mm | $\epsilon_{310}(0°) = 3.0\%$ | $\epsilon_{310} = 3.5\%$ |

The following assumptions were made when formulating the simulation:
- the plates 1, 101, 201, 301 and the plate of the reference module are made of the same glass having the ALBARINO composition as marketed by Saint-Gobain Glass;
- the radiation incident on the module 10, 110, 210, 310 and on the reference module has an energy distribution corresponding to a standard solar spectrum;
- evaluation of the efficiency of the photovoltaic cells 9, 109, 209, 309 and of the reference module as a function of the wavelength of the incident radiation, which corresponds to the ratio of the number of collected electrons to the number of photons that reach the cell, taking as reference a photovoltaic cell based on polycrystalline silicon; however, the results are applicable to other types of photovoltaic cells since the improvement in the transmission properties of a plate due to the texturing of this plate does not depend significantly on the wavelength of the radiation incident on the plate.

The data in Table 1 show that the increase in the annual overall efficiency $\epsilon_{10}$ of each of the modules 10, 110, 210 according to the invention is greater, by about 1%, than the increase $\epsilon_{310}$ of the annual overall efficiency of the module 310 according to the prior art.

Analyzing the basic mechanisms that allow an increase of the transmission of a textured plate relative to an untextured plate makes it possible to explain theoretically why the increase in the efficiency of an energy conversion device may be maximized by increasing, even maximizing, the thickness of the features of the textured plate.

The first basic mechanism that allows an increase of the transmission of a textured plate is the trapping of the incident radiation by way of multiple reflections on the features in relief of the plate. As is clear from FIGS. 2 to 5, for radiation rays $E_1$ incident on the plate 1, 101, 201, 301 at small angles of incidence, multiple reflections occur on the features 5, 105, 205, 305 in relief of the textured face 3, 103, 203, 303, which offer the radiation a greater number of possibilities $E_{t1}$, $E_{t2}$ of entering into the plate, hence a reduction of the reflection on the textured face 3, 103, 203, 303 of the plate 1, 101, 201, 301 relative to the flat face of an untextured plate.

However, because the features 5, 105, 205, 305 are not perfect pyramids but, on the contrary, are rounded, this phenomenon of multiple reflections does not occur in every region of the textured face 3, 103, 203, 303. In particular, in the connecting zones 8, 108, 208, 308 corresponding to the rounded peaks and valleys of the pyramidal texture 5, 105, 205, 305, the aforementioned phenomenon of trapping the incident radiation does not occur, as shown by the arrows $E_{r1}$ located on the left in FIGS. 2 to 5. Consequently, to increase the transmission of the incident radiation through the plate, the area of these connecting zones 8, 108, 208, 308 should be decreased relative to the total textured area of the plate. In the above examples of plates 1, 101 and 201 according to the invention, this decrease of the area of the connecting zones is obtained by increasing the thickness of the features of the plate relative to the features of the plates according to the prior art, so that the area of each feature between two neighboring connecting zones, i.e. the surface area of the feature that participates in the multiple reflections, is higher.

Moreover, the radiation is reflected, after entering into the plate 1, 101, 201, 301, at the interface between the plate and the cells 9, 109, 209, 309 or an optional lamination interlayer, and is once more trapped by reflection on the faces of the features 5, 105, 205, 305, so that a larger part of the radiation is transmitted through the plate. The losses by reflection are thus still further reduced, for a textured plate relative to an untextured plate, by virtue of this second radiation trapping. Here again, the decrease in the area of the connecting zones 8, 108, 208, 308 relative to the total textured area of the plate, or, in other words, the increase in the area of each feature that participates in the multiple reflections on the feature, increases the second trapping of the radiation and its transmission through the plate.

The second basic mechanism that allows an increase of the transmission of a textured plate is that, for radiation rays F, incident on the plate at large angles of incidence, greater than 45°, the angles of incidence of the radiation on the faces of the features 5, 105, 205, 305 are lower than those on a flat surface. For example, with pyramidal features of 45° apex half-angle, even when rounded, the radiation rays F, incident at an angle varying between 0 and 90° on a flat surface strike the surface of the texture 5, 105 at an angle of incidence that lies between −45° and +45°. As large angles of incidence, close to 90°, favor reflection at the air/glass interface, replacing angles of incidence in the 0° to 90° range with those in the −45° to +45° range leads to reflection being substantially reduced. The decrease, relative to the total textured area of the plate, of the area of the connecting zones 8, 108, 208, 308, i.e. the zones of the plate with the smallest inclination relative to the plane $\pi$, thus also allows an increase of the transmission through the plate by means of this second mechanism.

It is clear from Table 1, and from the above theoretical explanation, that a plate according to the invention, of which the ratio of the area $S_8$, $S_{108}$, $S_{208}$ of the connecting zones to the total textured area $S_1$, $S_{101}$, $S_{201}$ of the plate has been reduced relative to that of plates according to the prior art, has optimized properties for transmission of a radiation incident on the plate. Consequently, such a plate, when it is integrated into a photovoltaic module as the front substrate, substantially improves the efficiency of this module relative to the efficiency of modules according to the prior art.

The improvement of the transmission through the textured plate is obtained, according to the invention, by increasing the useful surface area of the features of the plate, that is to say the area of the features which is useful for receiving and transmitting radiation, whether this is by multiple reflection or by decreasing the angle of incidence seen by the surface of the feature. In doing so, the percentage of the total textured area of the plate corresponding to rounded connecting zones is reduced and the profile of the features of the textured plate approaches perfect geometry.

In order to increase the useful area of the features, the invention proposes to increase the thickness of the textured plate according to the invention, relative to the textured plates according to the prior art, for a given value of the ratio $\rho$ of the thickness of each feature to the thickness of the plate, as shown in the first and second embodiments. It is clear from these embodiments that the transmission of radiation through the textured plate according to the invention is improved relative to the transmission of radiation through the textured plates according to the prior art, even though the thickness of the plate according to the invention, and therefore the absorption of radiation in the plate, is greater. Indeed, the inventors have demonstrated that the increase in the transmission through the textured plate according to the invention, which is caused by the increase of the thickness of the features and therefore of the useful area of these features, is likely, for certain plate thicknesses, to be greater than the increase in the absorption of radiation inside the plate, which is caused by the increase of the thickness of the plate, especially for a plate composition with a low radiation absorption.

For a given value of the ratio $\rho$, the thickness of the textured plate according to the invention is preferably chosen to be equal to an optimal thickness value at which the transmission through the plate, due to the increase of the thickness of the features, counteracts as best as possible the increased absorption inside the plate due to the increase of the thickness of the plate, that is to say a thickness value at which the transmission through the plate of a radiation incident on the textured face of the plate is maximized. In particular, for a given value of the ratio $\rho$ greater than or equal to 0.2, which is a conventional value of the ratio $\rho$ of textured plates according to the prior art, the thickness of the textured plate according to the invention is preferably chosen to be greater than or equal to 4.5 mm. Within the scope of its application as the front substrate of an energy conversion device, such as a photovoltaic module or a OLED device, the thickness of a textured plate according to the invention is preferably also kept less than or equal to 8 mm, in order for the weight of the device to remain moderate.

Another way to increase the useful area of the features consists, as shown by the third embodiment, in increasing the ratio $\rho$ of the thickness of each feature to the thickness of the plate, relative to the ratio $\rho$ of the textured plates according to the prior art, for a given plate thickness. The useful area of the features for receiving and transmitting a radiation is then increased by increasing the thickness of each feature. In this case, for conventional plate thicknesses, for example lying between 3 mm and 4 mm, the ratio $\rho$ of the textured plate according to the invention is preferably chosen such that $0.3 \leq \rho$. In addition, in the case of a glass plate textured by rolling, a maximum value $\rho = 0.5$ is imposed in practice, because of the rolling process, in order to avoid problems with the glass sticking to the rollers used for the rolling process.

The invention is based on the discovery, by the inventors, that conventional methods of manufacture, namely rolling and molding, cause radii of curvature at the peaks and valleys of the features in relief, which radii of curvature do not change whatever the thickness of the features and the thickness of the plate. It might have been thought that these radii of curvature would increase in proportion with the thickness of the features and the thickness of the plate. Surprisingly, the average radii of curvature always stay the same for a given method of manufacture by rolling or molding, in particular, about a few hundreds microns for radii of curvature r and R in the case of rolling. The inventors, on the basis of these unchanging radii or curvature, have obtained a more effective texture in that the transmission through the plate is increased. The inventors, to this end, chose in particular to increase the thickness of the plate for a given value of the ratio $\rho$. As a variant, they also envisaged increasing the ratio $\rho$ for a given value of the plate thickness.

The invention is not limited to the examples described and shown. In particular, the texture of a plate according to the invention may be formed by an assembly of features other than pyramidal features. The features of a plate according to the invention may, in particular, be cones or elongate features like grooves or ribs. When the texture of the plate is formed by pyramidal or conical features, these features have, advantageously, a polygonal base, especially a triangular, square, rectangular, parallelogram, hexagonal or octagonal base. More generally, the features of a plate according to the invention are such that they comprise at least two sides inclined relative to a general plane $\pi$ of the face of the plate containing the features. In addition, as each side of a feature is not necessarily planar, the inclination angle of a side relative to the general plane $\pi$ is defined as an average inclination angle , defined between an average surface of the side and the plane $\pi$.

The texture of a plate according to the invention may also be a concave texture, instead of a convex texture, the features then being recessed relative to the general plane of the textured face of the plate. In addition, the features of the plate according to the invention, although preferably contiguous, may also not be contiguous. Likewise, a random distribution of the features over the textured face of the plate, although advantageous, is not obligatory. The features of a textured plate according to the invention may be identical to one another, as in the embodiments described above, or different from one another. Furthermore, the features of a plate according to the invention may be formed over the entire surface of the relevant face of the plate or, as a variant, only over one or more distinct regions of this surface.

Moreover, a textured plate according to the invention may be made of an extra-clear transparent glass of any composition, particularly the glass "ALBARINO" or an extra-clear transparent float glass such as the glass "DIAMANT" marketed by Saint-Gobain Glass. In particular, texturing by rolling may be carried out by means of a textured roller integrated into a glass float device. A textured plate according to the invention may also be made of a transparent material other than glass, for example a transparent thermoplastic polymer such as polycarbonate or polymethyl methacrylate.

According to a variant of the invention, not shown, a plate according to the invention may also be textured on both its faces and not only on one of its faces as in the examples described and shown. Finally, one advantageous application of a textured plate according to the invention, having optimized properties for transmission of a radiation incident on the plate, is its use as the front substrate of an energy conversion device, such as a photovoltaic module, a thermal module or an OLED device. However, a textured plate according to the invention may also be used as a decorative glazing element.

The invention claimed is:

1. A monolithic transparent plate comprising:
   on at least one of its faces, at least one region textured by a plurality of geometric features in relief relative to a general plane of the face, each feature having a cross section, parallel to the general plane, that diminishes with distance from the face, from a base to a peak of the feature,
   wherein an area of a zone of the textured region for which the inclination angle relative to the general plane is less than 30° represents less than 35% of the total area of the textured region,
   and wherein
   either (i) the ratio of the thickness of each feature to the thickness of the plate has a given value that is greater than or equal to 0.2 and the thickness of the plate lies within a range extending from 4.5 mm to 8 mm,
   or (ii) the thickness of the plate has a given value that lies within a range extending from 3 mm to 8 mm and the ratio of the thickness of each feature to the thickness of the plate is greater than or equal to 0.3.

2. The plate as claimed in claim 1, wherein each feature is bounded, in cross section along at least one plane passing through the peak of the feature and perpendicular to the general plane, by two sides each inclined at a nonzero average inclination angle relative to the general plane, the zone of the textured region for which the inclination angle of the zone relative to the general plane is less than 30° form a connecting zone between one side of a feature and the other side of the feature or the side of an adjacent feature.

3. The plate as claimed in claim 2, wherein the average inclination angle of each side of a feature relative to the general plane lies between 40° and 65°, or between 45° and 60°.

4. The plate as claimed in claim 1, wherein each feature has a thickness greater than or equal to 0.5 mm.

5. The plate as claimed in claim 1, wherein, for a given value of the ratio of the thickness of each feature to the thickness of the plate, the thickness of the plate has an optimal value that corresponds to maximum transmission through the plate of a radiation incident on the face of the plate.

6. The plate as claimed in claim 1, wherein the features are contiguous.

7. The plate as claimed in claim 1, wherein the features are pyramids or cones having nonzero apex half-angles.

8. The plate as claimed in claim 1, wherein the features are grooves or ribs.

9. The plate as claimed in claim 1, wherein the textured region is obtained by rolling.

10. The plate as claimed in claim 1, wherein the textured region is obtained by molding.

11. An assembly comprising:
    a transparent plate as claimed claim 1; and
    an element capable of collecting or emitting radiation, the element being positioned relative to the plate so as to be able to collect a radiation passing through the plate or to emit a radiation through the plate, the textured face of the plate being directed away from the element.

12. A method of manufacturing a transparent plate as claimed in claim 1, comprising:
    forming, on at least one face of a plate made of a transparent material, geometric features in relief relative to a general plane of the face, while maximizing the thickness of each feature in relief.

13. The manufacturing method as claimed in claim 12, wherein the features in relief are formed by rolling the plate.

14. The manufacturing method as claimed in claim 12, wherein the features in relief are formed by molding the plate.

* * * * *